United States Patent
Ryu et al.

(10) Patent No.: US 9,105,409 B2
(45) Date of Patent: Aug. 11, 2015

(54) DYE-SENSITIZED SOLAR CELL AND MANUFACTURING METHOD FOR THEREOF

(75) Inventors: Seunghoon Ryu, Bucheon-si (KR); Kiyong Kim, Gwacheon-si (KR); Seongkee Park, Goyang-si (KR); Sunghoon Joo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 471 days.

(21) Appl. No.: 12/629,477

(22) Filed: Dec. 2, 2009

(65) Prior Publication Data

US 2010/0326505 A1    Dec. 30, 2010

(30) Foreign Application Priority Data

Jun. 25, 2009 (KR) .................. 10-2009-0057297

(51) Int. Cl.
*H01L 31/00* (2006.01)
*H01L 31/042* (2014.01)
*H01G 9/20* (2006.01)

(52) U.S. Cl.
CPC ........... *H01G 9/2022* (2013.01); *H01G 9/2013* (2013.01); *H01G 9/2031* (2013.01); *H01G 9/2059* (2013.01); *H01L 2251/306* (2013.01); *Y02E 10/542* (2013.01)

(58) Field of Classification Search
CPC .................................................. H01G 9/2022
USPC ......................................... 136/252, 250, 263
See application file for complete search history.

(56) References Cited

U.S. PATENT DOCUMENTS

| | | | |
|---|---|---|---|
| 2003/0230335 A1* | 12/2003 | Tsukahara | 136/252 |
| 2006/0234065 A1* | 10/2006 | Ohno et al. | 428/432 |
| 2006/0266411 A1* | 11/2006 | Sugiyama et al. | 136/263 |
| 2007/0068569 A1* | 3/2007 | Nam et al. | 136/255 |
| 2009/0090411 A1* | 4/2009 | Choi et al. | 136/252 |

FOREIGN PATENT DOCUMENTS

JP          2007273240 A       10/2007

* cited by examiner

*Primary Examiner* — Alexander Kollias
(74) *Attorney, Agent, or Firm* — Brinks Gilson & Lione

(57) ABSTRACT

Dye-sensitized solar cell and a manufacturing method for the same are disclosed. Dye-sensitized solar cell according to one embodiment of this document can comprise a first substrate including a first electrode, a photo-absorption layer positioned on the first substrate, and a second substrate including a second electrode, the second substrate positioned on the photo-absorption layer and the photo-absorption layer including a middle layer where a plurality of holes are formed.

3 Claims, 3 Drawing Sheets

(a)          (b)          (c)

DYE-SENSITIZED SOLAR CELL AND MANUFACTURING METHOD FOR THEREOF

This application claims the benefit of Korean Patent Application No. 10-2009-0057297 filed on Jun. 25, 2009 which is hereby incorporated by reference in its entirety.

BACKGROUND

1. Field

This disclosure relates to dye-sensitized solar cell. More specifically, this document is related to high-efficiency dye-sensitized solar cell and a manufacturing method for the same.

2. Description of the Related Art

Research is being conducted in for a substitute for fossil fuels to resolve the imminent energy crisis. In particular, to substitute for oil resources which may be exhausted in a few decades, researchers are focusing on how to utilize natural energy resources such as wind, atomic, and solar energy.

Different from the other potential substitutes, a solar cell is eco-friendly and makes use of unlimited solar energy. The solar cell is, therefore, receiving wide-acceptance since the development of Si solar cell at 1983, particularly due to the recent energy crisis.

However, the manufacturing cost of a silicon solar cell is high due to severe international competition caused by a demand and supply problem of Si raw material. To resolve the problem, many research organizations domestic or foreign proposed self-rescue plans. Still, difficulties remain to actually perform the plans. One of the alternative solutions to resolve the serious energy crisis is a dye-sensitized solar cell; ever since a research team headed by Dr. Micheal Graetzel of EPFL, Swiss has developed the dye-sensitized solar cell in 1991, the academic society has paid much attention thereto and many research organizations have been conducting research for the dye-sensitized solar cell.

Different from silicon-based solar cell, the dye-sensitized solar cell is an opto-electrochemical solar cell whose primary ingredients comprise photosensitive dye molecules that can generate electron-hole pairs by absorbing visible light and transition metal oxide that transfers the generated electrons. A dye-sensitized solar cell utilizing nano-particle titanium oxide is regarded as a typical research outcome among the previous research works for dye-sensitized solar cell.

Manufacturing cost of a dye-sensitized solar cell is lower than the conventional silicon solar cell. What is more, a dye-sensitized solar cell can be used for the windows of outer walls of a building or a glasshouse due to the transparent electrodes thereof. More research is needed, however, because of the low photoelectric conversion efficiency.

The photoelectric conversion efficiency of a solar cell is proportional to the number of electrons generated by absorption of sunlight. To increase the efficiency, therefore, increasing the number of electrons generated by increasing the amount of dye absorbed by titanium oxide nano-particles, increasing absorption of sunlight, and preventing generated excited-electrons from being annihilated from electron-hole recombination are required.

To increase the rate of dye absorption for a unit area, particles of oxide semiconductor are required to be fabricated in a nanometer scale. To that end, a manufacturing method of increasing reflectivity of platinum electrodes to facilitate absorption of sunlight or a method of mixing the particles with optical scattering material made from oxide semiconductor has been developed.

The previous methods, however, have revealed limitation to increasing the photoelectric conversion efficiency. Accordingly, development of a new technology for enhancing the efficiency is highly demanded.

SUMMARY

Dye-sensitized solar cell according to one embodiment of this disclosure comprises a first substrate including a first electrode, a photo-absorption layer positioned on the first substrate, and a second substrate positioned on the photo-absorption layer and including a second electrode, the photo-absorption layer including a middle layer where a plurality of holes are formed.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION OF PREFERRED EMBODIMENTS

Reference will now be made in detail embodiments of the invention examples of which are illustrated in the accompanying drawings.

Dye-sensitized solar cell according to one embodiment of this disclosure comprises a first substrate including a first electrode, a photo-absorption layer positioned on the first substrate, and a second substrate positioned on the photo-absorption layer and including a second electrode, the photo-absorption layer including a middle layer where a plurality of holes are formed.

The photo-absorption layer can include a plurality of semiconductor particles including electrolyte and dye.

The middle layer can be positioned at the central section of the photo-absorption layer.

The middle layer can be FTO glass.

The middle layer can include a platinum-doped layer where platinum is doped on the surfaces facing the first and second electrode.

A method for manufacturing dye-sensitized solar cell according to one embodiment of this disclosure comprises forming a first electrode on a first substrate, forming a photo-absorption layer including a middle layer where a plurality of holes are formed on the first electrode, forming a second substrate including a second electrode on the photo-absorption layer, and injecting electrolyte into the photo-absorption layer.

The forming a photo-absorption layer can comprise forming a plurality of semiconductor particles including dye on the first electrode and forming the middle layer on the semiconductor particles.

The middle layer can be formed by FTO glass.

The middle layer can form a platinum-doped layer by doping platinum on the surfaces facing the first and second electrode.

A plurality of holes in the middle layer can be formed by using a drill or laser.

In the following, with reference to appended drawings, embodiments of this disclosure will be described.

Figure 1:
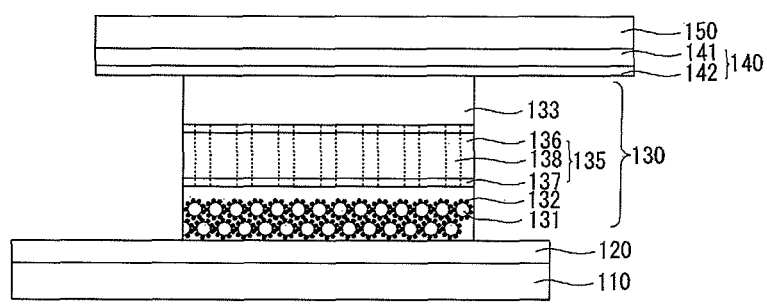
FIG. 1 illustrates dye-sensitized solar cell according to one embodiment of this disclosure.

FIG. 1 illustrates dye-sensitized solar cell according to one embodiment of this disclosure.

With reference to FIG. 1, dye-sensitized solar cell 100 according to one embodiment of this disclosure can comprise a first substrate 110 including a first electrode 120, a photo-absorption layer 130 positioned on the first substrate 110, and a second substrate 150 positioned on the photo-absorption layer 130 and including a second electrode 140.

Dye-sensitized solar cell 100 has sandwich structure where a first electrode 120 and a second electrode 140 are joined together facing with each other. More specifically, a first electrode 120 is positioned on a first substrate 110 and a second electrode 140 is facing the first electrode 120, the second electrode 140 positioned on a second substrate 150 that faces directly to the first electrode 120.

Between the first electrode 120 and the second electrode 140, a photo-absorption layer 130 can be positioned, where the photo-absorption layer 130 includes semiconductor particles 131, dye 132 absorbed in the semiconductor particles 131, and electrolyte 133.

The first substrate 110 can be made of glass or plastic but any material can be employed if the material possesses transparency that enables incidence of external light.

A specific example of plastic can be polyethyleneterephthalate (PET), polyethylenenaphthalate (PEN), polycarbonate (PC), polypropylene (PP), polyimide (PI), triacetylcellulose (TAC), or copolymer thereof.

The first electrode 120 can include conductive metal oxide.

At this time, conductive metal oxide can be selected from a group consisting of indium tin oxide (ITO), fluoride tin oxide (FTO), ZnO—($Ga_2O_3$ or $Al_2O_3$), Sn-based oxide, antimonide tin oxide (ATO), zinc oxide (ZnO), and a compound thereof, preferably, $F:SnO_2$.

A photo-absorption layer 130 can include semiconductor particles 131, dye 132 absorbed in the semiconductor particles 131, and electrolyte 133.

The semiconductor particles 131 can use compound semiconductor or a compound of Perovskite structure as well as single element semiconductor represented by silicon.

The semiconductor can be n-type semiconductor that provides anode current by employing electrons in conduction band as carriers under optical excitation. The compound semiconductor can use metal oxide selected from a group consisting of titan (Ti), tin (Sn), zinc (Zn), tungsten (W), zirconium (Zr), gallium (Ga), Indium (In), yttrium (Yr), niobium (Nb), tantalum (Ta), and vanadium (V). Preferably, the compound semiconductor can use titan oxide ($TiO_2$), tin oxide ($SnO_2$), zinc oxide (ZnO), niobium oxide ($Nb_2O_5$), titan strontium oxide ($TiSrO_3$), or compound thereof. More preferably, the compound semiconductor can use titan oxide ($TiO_2$) of anatase type. Types of the semiconductor are not limited to those above but a single type or combination of more than two types can be used.

Also, average particle size of semiconductor particles 131 can range from about 1 nm to about 500 nm, preferably from about 1 nm to about 100 nm. Semiconductor particles 131 can use a combination of large and small sized particles or form a multi-layer.

Semiconductor particles 131 can be manufactured in various ways: forming a thin film of semiconductor particles 131 by spraying them directly on a substrate; deposing electrically a thin film of semiconductor particles by using substrates as electrodes; or spreading paste obtained by hydrolyzing slurry of semiconductor particles or precursor of semiconductor particles on a substrate with subsequent drying, hardening, and plastic deformation.

On the surface of the semiconductor particles 131, dye 132 that absorbs external light and generates excited electrons can be deposited.

The dye 132 can be formed as a metal composite including aluminum (Al), platinum (Pt), palladium (Pd), europium (Eu), lead (Pb), iridium (Ir), and ruthenium (Ru). In particular, since ruthenium (Ru), an element belonging to platinum group, can form various organometallic compounds, it is desirable to use dye 132 containing ruthenium (Ru).

As an example of dye 132 containing ruthenium (Ru), $Ru(etcbpy)_2(NCS)_2 \cdot CH_3CN$ type is used frequently. In this case, etc, $(COOEt)_2$ or $(COOH)_2$, is a reactor that can be combined with the surface of porous membrane.

On the other hand, dye containing organic colorant can be used. For organic colorant, coumarin, porphyrin, xanthenes, riboflavin, or triphenylmethan can be used individually or combined with other composite.

The electrolyte 133 can use redox electrolyte. More specifically, halogen compound with halogen ion as large ion; halogen oxidation and reduction electrolyte composed of halogen molecules; metal oxidation and reduction electrolyte such as metal complex including ferrocyanide, ferrocene-ferrocenium ion, and cobalt complex; and organic oxidation and reduction electrolyte such as alkylthiol-alkyldisulphide, viologen dye, and hydroquinone-quinone, preferably, halogen oxidation and reduction electrolyte.

As for halogen molecules related to halogen oxidation and reduction electrolyte composed of halogen compound-halogen molecules, iodine molecules are preferred. Also, as for halogen compound with halogen ion as large ion, metal salt halide such as LiI, NaI, $CaI_2$, $MgI_2$, and CuI; organic ammonium salt halide such as tetra-alkylammonium iodine, imidazolium iodine, and pyridinium iodine; or I2 can be used.

If redox electrolyte is in the form of solution that contains the same, a solvent electrochemically inactive can be employed. More specific examples include acetonitrile, propylene carbonate, ethylene carbonate, 3-methoxypropionitrile, methoxyacetonitrile, ethylene glycol, propylene glycol, diethylene glycol, triethylene glycol, butyrolactone, dimethoxyethane, dimethyl carbonate, 1,3-dioxolane, methyl formate, 2-methyltetrahyrofuran, 3-methoxy-oxazolidine-2-on, sulfolane, tetrahydrofuran, and water. In particular, acetonitrile, propylene carbonate, ethylene carbonate, 3-methoxypropionitrile, ethylene glycol, 3-methoxy-oxazolidine-2-on, and butyrolactone are preferred. The aforementioned solvents can be used individually or being mixed with others.

The photo-absorption layer 130 can include a middle layer 135.

The middle layer 135 comprises fluorine-doped tin oxide (FTO) coated conduction glass 136, platinum-doped layer 137 doped on the FTO glass 136, and a plurality of holes 138.

The FTO glass 136 has excellent conductivity and can be made in such a way that fluorine tin oxide (FTO) is formed on a transparent glass substrate which allows penetration of external light.

The middle layer 135, in addition to FTP glass 136, can further comprise a platinum-doped layer 137 whose surfaces that face a first electrode 120 and a second electrode 140 are coated with platinum (Pt). The platinum-doped layer 137 enhances conductivity of the middle layer 135.

The middle layer 135 can include a plurality of holes 138. The plurality of holes 138 can be made to penetrate the surfaces facing the first electrode 120 and the second electrode 140.

Figure 2:
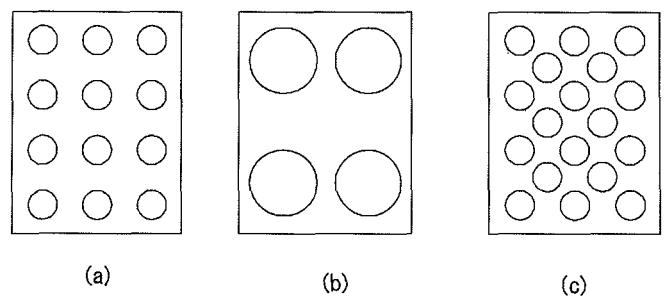
FIG. 2 illustrates floor plans for different embodiments of a middle layer of this disclosure.

FIG. 2 illustrates floor plans of the middle layer 135 in which a plurality of holes are formed.

With reference to FIGS. 2A to 2C, the number of holes can be more than one and is not fixed. The size of a hole 138 can be varied and the position of the hole 138 can also be chosen variously.

The plurality of holes 138 enhances transfer efficiency of electrons within solar cell.

To describe in more detail, the operating principle of solar cell is that electrons are excited as external light is absorbed in dye and the excited electrons are injected to a first electrode through semiconductor particles, generating current. Degradation of photoelectric conversion efficiency is caused by the difference of electron transfer efficiency between the respective interfaces of contacting components, particularly between individual electrodes and electrolyte.

In an embodiment of this disclosure, by fabricating transfer paths of electrons by forming a plurality of holes 138 in the middle layer 135 of excellent conductivity within a photo-absorption layer including electrolyte, electron transfer efficiency within a photo-absorption layer can be enhanced. Accordingly, the above brings an advantageous effect that photoelectric conversion efficiency of solar cell is enhanced.

The thickness of the aforementioned photo-absorption layer 130 including the middle layer 135 is less than about 15 µm, preferably about 1 µm to about 15 µm but is not specified particularly.

A second substrate 150 including a second electrode 140 can be positioned on the photo-absorption layer 130.

A second electrode 140 can include a transparent electrode 141 and catalytic electrode 142. The transparent electrode 141 can be formed by transparent material such as indium tin oxide, fluorine tin oxide, antimony tin oxide, zinc oxide, tin oxide, or ZnO—($Ga_2O_3$ or $Al_2O_3$).

The catalytic electrode 142 activates an oxidation and reduction (redox) couple and can use conductive material such as platinum, gold, ruthenium, palladium, rhodium, iridium, osmium, carbon, titan oxide, and conductive polymer.

It is preferable for the catalytic electrode 142, which is facing the first electrode 120 to enhance catalytic effect of oxidation and reduction, to enlarge the surface area thereof by employing micro structure. For example, lead or gold is preferred to remain in black state, while carbon is preferred to remain in porous state. In particular, platinum in black state can be formed by applying anodic oxidation method or chloroplatinic acid treatment, while carbon in porous state can be formed by sintering of carbon particles or calcinations of organic polymer.

The second substrate 150 can be made of glass or plastic in the same way as the foregoing first substrate 110. A specific example of plastic can be polyethyleneterephthalate (PET), polyethylenenaphthalate (PEN), polycarbonate (PC), polypropylene (PP), polyimide (PI), or triacetylcellulose (TAC).

If the dye-sensitized solar cell 100 is exposed to sunlight, photons are first absorbed in the dye 132 within the photo-absorption layer 130. Accordingly, dye 132 generates electron-hole pairs by electronic transition from ground state to excited state and electrons in excited state are injected to the conduction band of the contacting surface of semiconductor particles 131. Injected electrons transfer to the first electrode 120 through the contacting surface and subsequently move to the second electrode 140, the opposite electrode, through an external circuit.

Meanwhile, the dye 132 oxidized by electron transition is reduced by ions of oxidation-reduction couples within electrolyte 133. The oxidized ions carry out a reduction response with electrons arrived at the contacting surface of the second electrode 140 to attain charge neutrality, leading to the operation of the dye-sensitized solar cell 100.

In what follows, a method of manufacturing dye-sensitized solar cell according to the foregoing embodiment of this document is described.

FIGS. 3A to 3D illustrate cross sectional views of the respective processes comprising a method of manufacturing dye-sensitized solar cell of this disclosure.

Figure 3A:
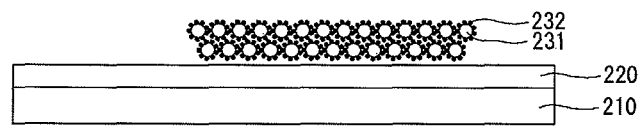
FIGS. 3A to 3D illustrate cross sectional views of the respective processes comprising a method of manufacturing dye-sensitized solar cell according to one embodiment of this disclosure.

With reference to FIG. 3A, a first electrode 220 is formed on a first substrate 210. As described above, a first substrate 210 can use glass or plastic and a first electrode 220 can also use the aforementioned material. For example, the electrode or substrate can be fabricated by forming a conduction layer including conductive material on a transparent glass by using a physical vapor deposition (PVD) method such as electroplating, sputtering, and E-beam deposition; and by doping the conduction layer with fluorine (F).

Subsequently, semiconductor particles 231 including dye 232 are formed on the fabricated first electrode 220.

To describe in more detail, semiconductor particle paste is coated on the first electrode 220, the semiconductor particle paste being made by dissolving semiconductor particle, binder, and polymer for forming pores into a solvent.

At this time, semiconductor particle can use the same material as described above. Binder can use polyvinylidene fluoride, poly hexafluoropropylene-polyvinylidene fluoride copolymer, polyvinyl acetate, alkylated polyethylene oxide, polyvinyl ether, poly alkylmetaacrylate, poly tetrafluoroethylene, poly vinylchloride, poly acrylonitrile, poly vinylpyridine, styrene-butadiene rubber, copolymer thereof, and combination thereof.

The polymer for forming pores can use polymer that does not leave organic material after a heating process. For example, the polymer can use polyethylene glycol, polyethylene oxide, polyvinyl alcohol, or polyvinyl pyrrolidone.

The solvent can use alcohol such as ethanol, isopropyl alcohol, n-propyl alcohol, or butyl alcohol; water, dimethylacetamide, dimethylsulfoxide, or N-methylpyrrolidone.

A semiconductor particle paste coating method can use screen printing, spray coating, doctor blade, gravure coating, dip coating, silk screening, painting, slit die coating, spin coating, roll coating, or transcription coating.

A heating process is applied after the semiconductor particle paste is coated

The heating process is carried out for 30 minutes or so at the temperature ranging from 400 to 600° C. when paste has been added during paste. Otherwise, the heating process can be carried out at the temperate lower than 200° C.

Next, dye 232 is deposited on the semiconductor particle film formed by the heating process either by spraying dispersion containing the dye 232 on the semiconductor particle film, thus spreading the dispersion thereon or soaking the semiconductor particle film in immersion liquid.

Deposition of the dye 232 can be finished about 12 hours later after a first substrate where semiconductor particle film has been formed is immersed in the dispersion that contains the dye 232. Time needed for deposition can be shortened by applying heating. At this time, the aforementioned material can be used for dye; and acetonitrile, dichloromethane, or alcohol-based solvent can be used for the solvent that disperses dye.

Semiconductor particles 231 to which dye 232 has been deposited can be formed by solvent cleaning after the dye deposition process.

Figure 3B:
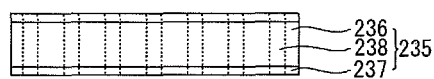

Next, with reference to FIG. 3B, a middle layer 235 including FTO glass 236, platinum-doped layer 237, and a plurality of holes 238 is formed.

To describe in more detail, FTO glass 236 is formed by forming a conduction layer including conductive material on a transparent substrate composed of glass or plastic by using a physical vapor deposition (PVD) method such as electroplating, sputtering, and E-beam deposition; and by doping the conduction layer with fluorine (F).

Next, both surfaces of FTO glass 236—that is, the surfaces that are to face a first electrode and a second electrode—are doped with platinum (Pt), thereby forming a platinum-doped layer 237.

Subsequently, by using a drill or laser, a plurality of holes 238 are formed on the FTO glass 236 in which platinum-doped layer 237 has been formed. In this case, as described above, a plurality of holes 238 can be formed in various ways without limitation to the number, size, and position of the holes.

Figure 3C:
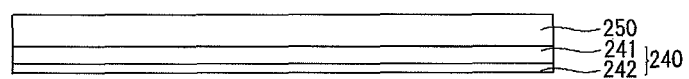

Next, with reference to FIG. 3C, a second substrate 250 including a second electrode 240 is formed.

To describe in more detail, transparent electrode 241 is formed by forming a conduction layer including conductive material on a transparent second substrate 250 composed of glass or plastic by using a physical vapor deposition (PVD) method such as electroplating, sputtering, and E-beam deposition; and by doping the conduction layer with fluorine (F).

Next, the transparent electrode 241 is coated with catalyst precursor solution dissolved in a solvent such as alcohol and then forms electrocatalyst 242 after receiving high temperature heat treatment at more than 400° C. degrees in the air or oxygen.

Figure 3D:
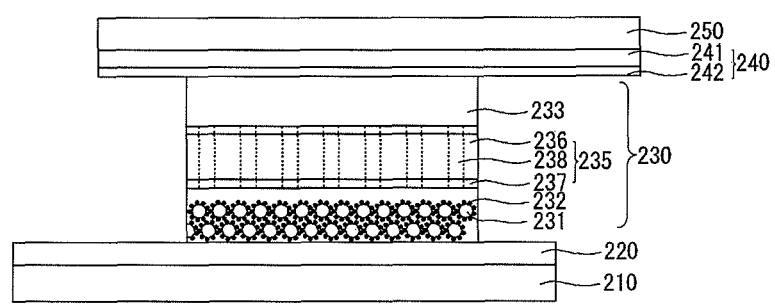

Next, with reference to FIG. 3D, a first substrate 210, a middle layer 230, and a second substrate 250 are joined together. More specifically, adhesive such as thermoplastic polymer film, epoxy resin, or ultraviolet hardener can be used for joining the surfaces together.

Fine holes that penetrate the second substrate 250 are formed and electrolyte 233 is injected through the holes to the space between both electrodes. At this time, electrolyte 233 can use the material described above.

Finally, the holes formed in the second substrate 250 after electrolyte 233 is injected are sealed hermetically by adhesive, thus accomplishing dye-sensitized solar cell 200 according to one embodiment of this document.

Hereinafter, preferred embodiments of this document will be described. The embodiments in the following are provided for the illustration purpose only and thus, this document is not limited to the following embodiments.

Embodiment: Manufacturing of Dye-sensitized Solar Cell (1) Manufacturing Working Electrode FTO glass (Fluorine-doped tin oxide coated conduction glass, Pilkington, TEC7) is cut by the size of 1.5 cm×1.5 cm and undergoes sonication cleaning for 10 minutes by using glass detergent; suds are completely removed by using distilled water. Next, sonication cleaning is repeated two times for 15 minutes by using ethanol. FTO glass is washed out completely by using ethanol absolute and dried in the oven at temperature of 100° C. To increase contact force against $TiO_2$, the FTO glass prepared through the above procedure is immersed in 40 mM titanium (IV) chloride solution of 70° C. for 40 minutes and washed out by using distilled water and dried completely in the oven at the temperature of 100° C. Next, titania ($TiO_2$) paste (18-NR) manufactured by CCIC Inc. is employed for dye and is coated on the FTO glass by using a screen printer and 9 mm×9 mm mask (200 meshs). Coated film is dried in the oven of 100° C. for 20 minutes, which is repeated three times. Subsequently, coated film undergoes plastic working at the temperature of 450° C. for 60 minutes, thereby obtaining $TiO_2$ film of about 10 μm thickness. Dye is deposited by immersing $TiO_2$ film after the heating process in the ethanol absolute solution of synthetic dye of 0.5 mM density for 24 hours. (At this time, in case dye is not melted by ethanol absolute, solvent is employed instead.) After deposition, remaining dye after ethanol absolute deposition is washed out completely and dried by using a heat gun.

(2) Manufacturing Middle Layer

Nine holes through which electrolyte can pass are generated by using a diamond drill (Dremel multipro 395) in the FTO glass of 0.5 cm×0.5 cm size. Next, the FTO glass is washed out by the same way as used for working electrode and dried. Subsequently, both surfaces of the FTO glass is coated with hydrogen hexachloroplatinate ($H_2PtCl_6$) 2-propanol solution; the FTO glass then undergoes plastic working for 60 minutes at the temperature of 450° C.

(3) Manufacturing Counter Electrode

Two holes through which electrolyte can pass are generated in the FTO glass of 1.5 cm×1.5 cm size by using ϕ0.7 mm diamond drill (Dremel multipro 395). Next, the FTO glass is washed out by the same way as used for working electrode and dried. Subsequently, both the FTO glass is coated with hydrogen hexachloroplatinate ($H_2PtCl_6$) 2-propanol solution; the FTO glass then undergoes plastic working for 60 minutes at the temperature of 450° C.

(4) Manufacturing Sandwich Cell

Surlyn (SX1170-25 Hot Melt) cut in the shape of a rectangular belt is put between the working electrode and counter electrode and the two electrodes are bonded together by using a clip and oven and electrolyte is injected through two small holes prepared in the counter electrode. Sandwich cell is then manufactured by sealing therewith surlyn strip and a cover glass. At this time, electrolyte solution is made by using 0.1M LiI, 0.05M I2, 0.6M 1-hexyl-2,3-dimethylimideazolium iodide and 0.5M 4-tert-butylpyridine with 3-metoxypropionitrile as solvent.

(5) Photocurrent-voltage Measurement

Light from Xe lamp (Oriel, 300 W Xe arc lamp) equipped with AM 1.5 solar simulating filter is applied on the sandwich cell manufactured above. Current-voltage curve is obtained by using M236 source measure unit (SMU, Keithley). The range of electric potential is from −0.8V to 0.2V and the intensity of light is set at 100 W/cm².

Figure 4:
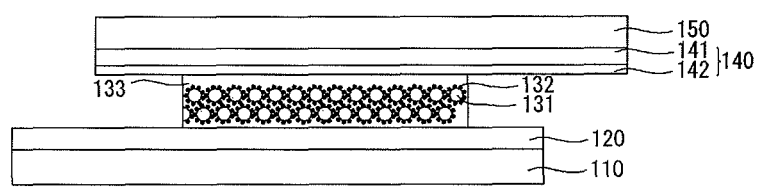
FIG. 4 illustrates dye-sensitized solar cell according to a comparative example of this disclosure.

A comparative example: dye-sensitized solar cell of FIG. 4 is manufactured by keeping the manufacturing conditions the same as the foregoing embodiment except for the manufacturing process of a middle layer. (Descriptions are not provided here because FIG. 4 contains the same elements and drawing symbols as FIG. 1.)

Figure 5:
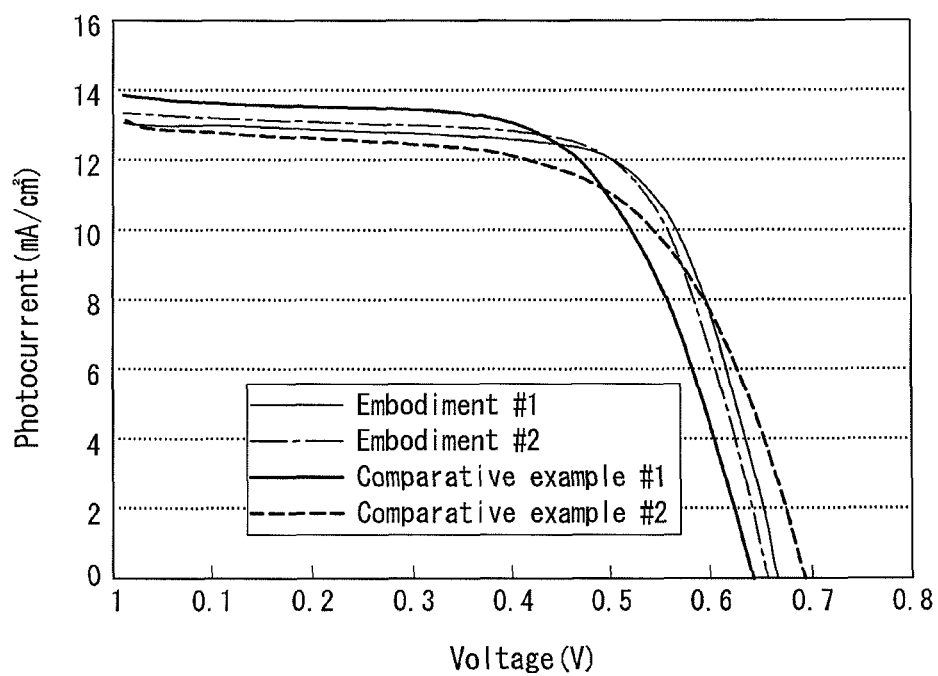
FIG. 5 illustrates a current-voltage curve of dye-sensitized solar cell manufactured according to an embodiment and a comparative example of this disclosure.

Short-circuit photocurrent density (Jsc), open circuit voltage (Voc), fill factor (FF), photoelectric conversion efficiency (PCE) of dye-sensitized solar cell manufactured according to the embodiment and comparative example are measured. Table 1 and FIG. 5 illustrate the measurement data. At this time, the embodiments and comparative example have been measured twice under the same conditions.

TABLE 1

| | # | Area(cm$^2$) | J$_{sc}$(mA) | V$_{oc}$(V) | FF(%) | PCE(%) |
|---|---|---|---|---|---|---|
| Embodiment | 1 | 0.249 | 13.084 | 0.673 | 0.695 | 6.126 |
| | 2 | 0.25 | 13.376 | 0.662 | 0.682 | 6.043 |
| Comparative | 1 | 0.25 | 13.862 | 0.648 | 0.624 | 5.618 |
| exmaple | 2 | 0.249 | 13.119 | 0.700 | 0.604 | 5.549 |

As shown in the Table 1 and FIG. 5, dye-sensitized solar cell manufactured according to the embodiment of this document provides superior photoelectric conversion efficiency (PCE) to that of the comparative example.

Therefore, dye for dye-sensitized solar cell according to one embodiment of this document and solar cell including the same form a middle layer containing a plurality of holes, thereby providing excellent photoelectric conversion efficiency (PCE).

The foregoing embodiments and advantages are merely exemplary and are not to be construed as limiting this document. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A dye-sensitized solar cell, comprising:
   a first substrate comprising a first electrode;
   a photo-absorption layer positioned on the first substrate;
   a second substrate positioned on the photo-absorption layer and comprising a second electrode; and
   an FTO glass middle layer,
   wherein the FTO glass middle layer comprises a plurality of holes and a platinum-doped layer on a first surface and a second surface of the FTO glass middle layer,
   wherein the first surface of the middle layer faces the first electrode and the second surface of the middle layer faces the second electrode, and
   wherein the plurality of holes completely penetrate the first and second surfaces of the FTO glass middle layer such that the plurality of holes function as transfer paths for electrons.

2. The dye-sensitized solar cell of claim 1, wherein the photo-absorption layer includes electrolyte; and a plurality of semiconductor particles including dye.

3. The dye-sensitized solar cell of claim 1, wherein the middle layer is positioned at a central section of the photo-absorption layer.

* * * * *